United States Patent
Okubo et al.

[11] Patent Number: 5,935,735
[45] Date of Patent: Aug. 10, 1999

[54] HALFTONE PHASE SHIFT MASK, BLANK FOR THE SAME, AND METHODS OF MANUFACTURING THESE

[75] Inventors: Kinji Okubo, Kasukabe; Tadashi Matsuo, Kuki; Takashi Haraguchi, Kumagaya, all of Japan

[73] Assignee: Toppan Printing Co., Ltd., Tokyo, Japan

[21] Appl. No.: 08/954,939

[22] Filed: Oct. 22, 1997

[30] Foreign Application Priority Data

Oct. 24, 1996 [JP] Japan .................................. 8-282409
Dec. 3, 1996 [JP] Japan .................................. 8-322521

[51] Int. Cl.$^6$ ...................................................... G03F 9/00
[52] U.S. Cl. ............................................................ 430/5
[58] Field of Search .................................. 430/5, 322, 311

[56] References Cited

U.S. PATENT DOCUMENTS

| | | | |
|---|---|---|---|
| 5,547,787 | 8/1996 | Ito et al. | 430/5 |
| 5,614,335 | 3/1997 | Hashimoto et al. | 430/5 |
| 5,721,075 | 2/1998 | Hashimoto et al. | 430/5 |

FOREIGN PATENT DOCUMENTS 0 668 539  8/1995  European Pat. Off. .

OTHER PUBLICATIONS

P.F. Carcia, et al., "Materials Screening for Attenuating Embedded Phase–Shift Photoblanks for DUV and 193nm Photolithography", *SPIE*, vol. 2884, pp. 255–263.

Patent Abstracts of Japan, No. 08054725, Feb. 27, 1996.

Patent Abstracts of Japan, No. 08171196, Jul. 2, 1996.

B. Smith, et al., "The Effects of Excimer Laser Radiation on Attenuated Phase–Shift Masking Materials", *SPIE*, vol. 3051, pp. 236–244.

*Primary Examiner*—S. Rosasco
*Attorney, Agent, or Firm*—Staas & Halsey

[57] ABSTRACT

A quartz glass substrate is placed in a DC or RF sputtering apparatus containing argon gas or oxygen gas. A zirconium compound target is reactively sputtered to form at least one halftone film made of a zirconium compound target on the substrate, thereby forming a blank for a halftone phase shift mask. The refractive index, the extinction coefficient, and the film thickness of the halftone film are so determined that the transmittance and the reflectance to exposure light are 2 to 15% and 30% or less, respectively, and the transmittance to inspection light is 30% or less. Examples of the zirconium compound are zirconium oxide, zirconium nitride, zirconium oxynitride, zirconium oxycarbide, zirconium carbonitride, zirconium halide, zirconium halide oxide, zirconium halide nitride, zirconium oxide silicide, zirconium nitride silicide, zirconium oxynitride silicide, zirconium oxycarbide silicide, zirconium carbonitride silicide, zirconium halide silicide, zirconium halide oxide silicide, and zirconium halide nitride silicide.

40 Claims, 8 Drawing Sheets

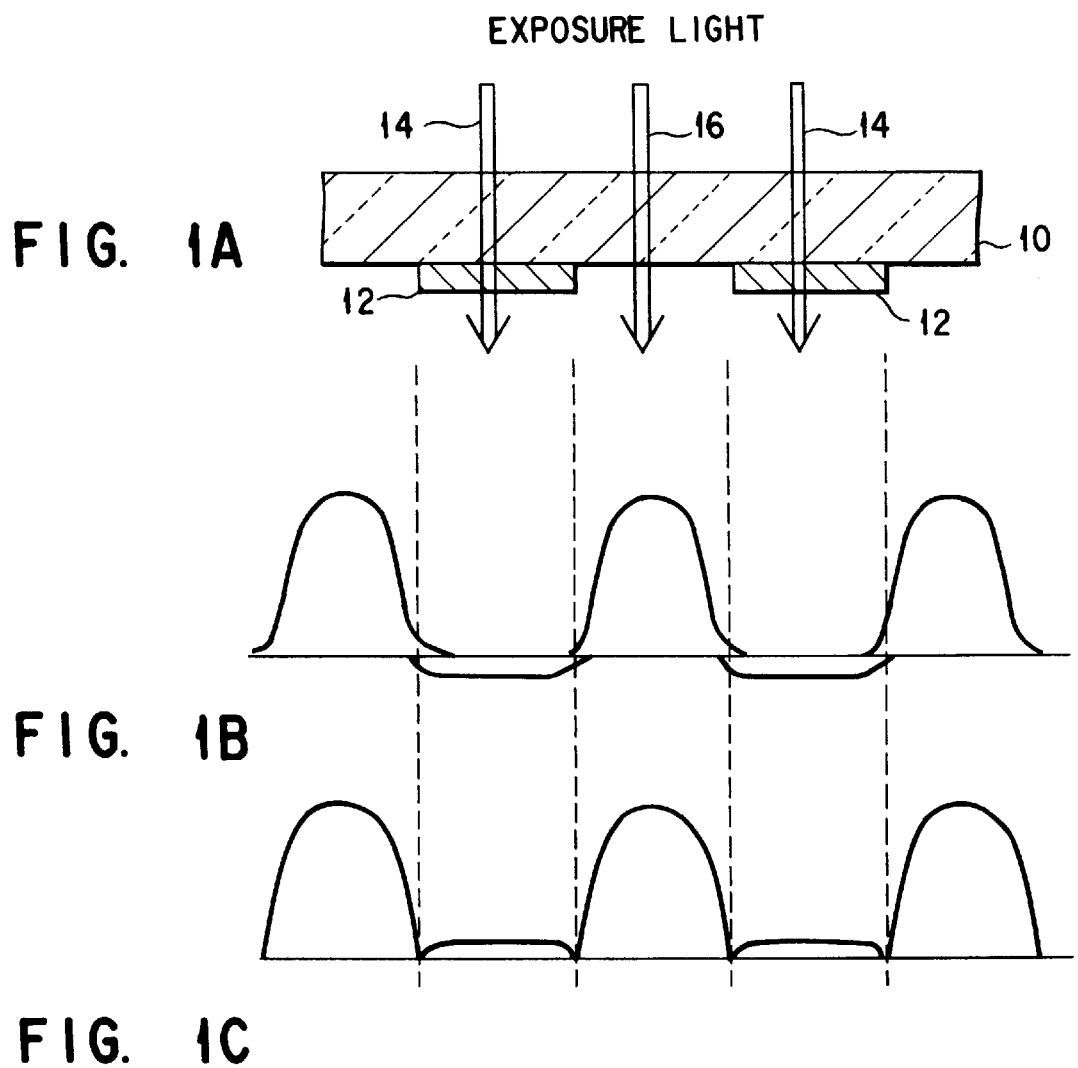

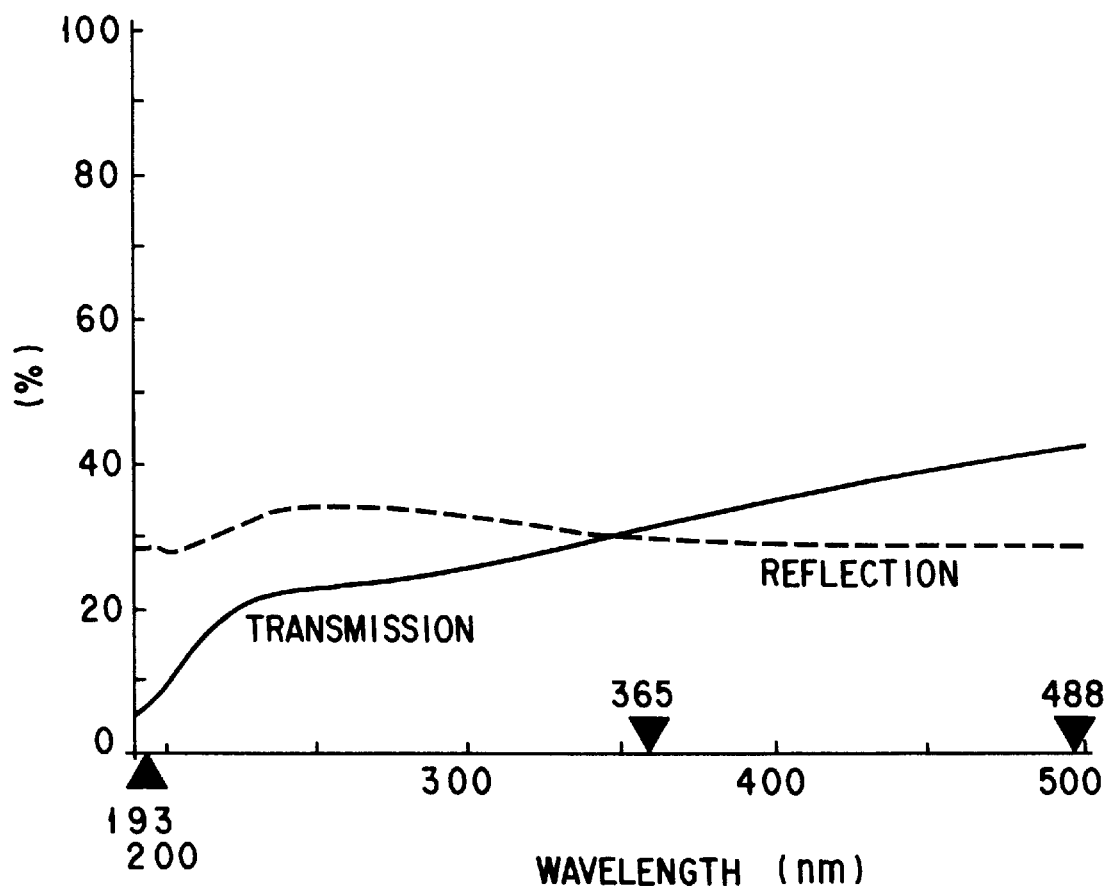
F I G. 10

HALFTONE PHASE SHIFT MASK, BLANK FOR THE SAME, AND METHODS OF MANUFACTURING THESE

BACKGROUND OF THE INVENTION

The present invention relates to a photomask used to transfer a pattern onto a wafer by exposure in a photolithography step of a semiconductor manufacturing process and a photomask blank for forming the photomask and, more particularly, to a halftone phase shift photomask or a blank for the photomask and methods of manufacturing these.

This application is based on Japanese Patent Application No. 8-282409, filed Oct. 24, 1996 and Japanese Patent Application No. 8-322521, filed Dec. 3, 1996, the content of which is incorporated herein by reference.

Conventional photomasks have the following problem. If fine patterns are projected onto a wafer to expose the wafer, and the patterns (light transmitting portions) are close to each other, lights transmitted through the light transmitting portions are diffracted and interfere with each other to increase the light intensity in the boundaries of the patterns (i.e., light-shielding (or opaque) portions). Consequently, the photoresist is exposed to light in light-shielding portions, and this makes the patterns transferred onto the wafer impossible to separate and resolve. This phenomenon becomes more perceptible as the pattern size closes to the wavelength of the exposure light. In principle, it has been impossible to separate and resolve fine patterns with geometries smaller than the wavelength of the exposure light by using conventional photomasks and conventional exposure optical systems.

Accordingly, a phase shift mask using a phase shift technology has been developed. The phase shift mask utilizes a difference in transmitting speed of light transmitted through various materials so that transparent thin films (phase shifters) are partially formed on the mask. The phase shift between the light transmitted through the phase shifter and the light not transmitted through the shifter improves the resolution.

The phase shift mask includes a Levenson type and a halftone type. Examples of the Levenson type phase shift mask are disclosed in Japanese patent KOKAI publication No. 58-173744 and Japanese patent KOKOKU publication No. 62-50811 (in which only the principle is described).

In the Levenson type phase shift mask, the lights transmitted through adjacent light transmitting portions have a phase shift of 180°. One of the adjacent light transmitting portions has a phase shifting function. When the transmitted lights are diffracted and interfere with each other, the light intensity in the boundaries of the patterns is decreased so that the fine pattern transferred onto the wafer can be separated and resolved. This relationship holds both before and after the focal point. Therefore, even if the focal point somewhat gets out of position, the resolution is improved than in conventional methods, and this improves the focusing margin.

However, these Levenson masks have not been put into practical use yet because their pattern design and manufacturing processes are complicated.

Examples of a halftone type phase shift mask are described in Japanese patent KOKAI publication No. 4-136854 and U.S. Pat. No. 4,890,309.

In the halftone masks, a light-shielding layer (non-transmitting layer) for forming patterns is not a complete light-shielding layer but a halftone layer which transmits a slight amount (a few %) of light. The optical constants of the halftone layer are such determined that the light passing through the halftone and the light not passing through the halftone have a phase shift of 180°. Such halftone phase shift masks are particularly effective in improving the resolution of an isolated pattern.

In addition to a phase shift amount of 180° as the original optical constant of a phase shift mask, a halftone phase shift mask and a mask blank must simultaneously have a low transmittance (2 to 15%) and a low reflectance (30% or less) at the exposure light wavelength, a low transmittance (30% or less) at the inspection light wavelength, and conductivity to some extent (100 M $\Omega/\square$ or less).

The reasons are as follows. If the reflectance of a photomask at the exposure light wavelength is high (more than 30%), multiple reflection occurs between the halftone layer and the wafer when photolithography is performed. This decreases the pattern accuracy.

Also, inspection and size measurement of a phase shift mask use light in the visible light region (e.g., the e-line (wavelength: 546 nm) of a high-pressure mercury lamp, an Ar ion laser beam (wavelength: 488 nm), or an He—Ne laser beam (wavelength: 633 nm)). If the transmittance is high (more than 30%) at the inspection light wavelength, the contrast between apertures forming patterns and the halftone layer decreases. This makes the inspection and size measurement difficult to perform.

Additionally, in patterning the halftone layer, if the conductivity of the halftone layer is low in electron-beam lithography for exposing an electron-beam resist, electrons are charged up to make accurate patterns impossible to form and allow easy adhesion of dust in manufacturing steps of a mask or when the mask is in use due to charging of static electricity.

To avoid the above problems, some phase shift masks are formed by overlapping two or more halftone films in order to decrease the reflectance to exposure light or give conductivity to the film surface. Examples are masks using molybdenum silicide and chromium compound. However, a number of problems have been pointed out for these films; the transmittance is high in the inspection light wavelength, the controllability and the reproducibility of these films are lower in a manufacturing step as the exposure light wavelength is shortened.

BRIEF SUMMARY OF THE INVENTION

The present invention has been made in consideration of the above situation and has as its object to provide a halftone phase shift mask blank and a halftone phase shift mask which have high pattern formation accuracy, satisfy optical conditions for a phase shift mask, capable of controlling the reflectance and transmittance at the exposure light wavelength and the transmittance at the inspection light wavelength, and also having conductivity, and provide methods of manufacturing these.

A blank for a halftone phase shift mask according to the present invention comprises a transparent substrate, and at least one halftone film layer formed on the substrate and made of a zirconium compound, the halftone film layer giving a phase shift of 180° between light transmitted through the halftone film and light not transmitted through the halftone film.

A halftone phase shift mask according to the present invention comprises a transparent substrate, and at least one patterned halftone film layer formed on the substrate and made of a zirconium compound, the halftone film layer giving a phase shift of 180° between light transmitted through the halftone film and light not transmitted through the halftone film.

Examples of the zirconium compound are zirconium oxide, zirconium nitride, zirconium oxynitride, zirconium oxycarbide, zirconium carbonitride, zirconium halide, zirconium halide oxide, zirconium halide nitride, zirconium oxide silicide, zirconium nitride silicide, zirconium oxynitride silicide, zirconium oxycarbide silicide, zirconium carbonitride silicide, zirconium halide silicide, zirconium halide oxide silicide, and zirconium halide nitride silicide.

The halftone phase shift mask blank and the phase shift mask of the present invention have a transmittance of 2 to 15% and a reflectance of 30% or less to exposure light, a transmittance of 30% or less to inspection light, and a conductivity of 100 M Ω/☐ or less.

Accordingly, enough contrast can be obtained during inspection. Also, it is possible to prevent the pattern accuracy from being decreased due to multiple reflection occurring between the halftone layer and the wafer during photolithography. Since there is no influence of multiple reflection, no antireflection layer is necessary. Additionally, inspection and size measurement of the mask can be easily performed because the contrasts during the inspection and measurement are satisfactory. It is possible to prevent charge-up during electron-beam lithography and improve the pattern formation accuracy. Charging of static electricity is eliminated, and easy adhesion of dust is prevented during manufacturing steps of the mask or when the mask is in use. Also, a zirconium film is hard, so it is possible to reduce defects caused by damage or marring in the step of manufacturing the phase shift mask or the test step and achieve sufficient durability against sulfuric acid in the cleaning step. Furthermore, the film has high pattern formation accuracy and high pattern shape reproducibility.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 1A to 1C are views for explaining the principle of a halftone phase shift mask;

FIG. 10 is a graph showing the spectral reflectance characteristic and the spectral transmittance characteristic of the seventh embodiment.

DETAILED DESCRIPTION OF THE INVENTION

Figure 2A:
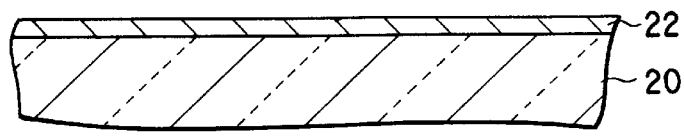
FIGS. 2A to 2C are sectional views for explaining manufacturing steps of the first embodiment of a halftone phase shift mask according to the present invention.

A preferred embodiment of a halftone phase shift mask according to the present invention will now be described with reference to the accompanying drawings.

FIGS. 1A to 1C are views for explaining the principle (the resolution when patterns are projected onto a wafer to expose the wafer) of a halftone phase shift mask. FIG. 1A is a view schematically showing the mask. In FIG. 1A, a semitransparent halftone film 12 having patterns formed in accordance with the patterns to be projected is formed on a transparent quartz glass substrate 10. Of exposure light incident perpendicularly on the mask surface, about 2 to 15% of light 14 is transmitted through the halftone film 12 although the amplitude attenuates. On the other hand, nearly 100% of light 16 is transmitted only through the glass substrate 10 without transmitted through the halftone film 12. Accordingly, the amplitude distribution of the exposure light on the wafer is as shown in FIG. 1B. Since the optical conditions of halftone film 12 are so determined that the phase of light transmitted through the halftone film is shifted by 180° (inverts) from the light in the air, the amplitudes of the lights 14 and 16 have opposite polarities. Since the square of the amplitude of light is proportional to the light intensity, the intensity distribution of the exposure light projected onto the wafer surface is as shown in FIG. 1C, and the light intensity at the boundaries of the pattern (the edge of the halftone film 12) is 0. Consequently, the edge contrast of the patterns improves, and this improves the resolution of the patterns. Furthermore, as a similar effect is obtained both before and after the focal point, the resolution increases even if the focal point somewhat gets out of position. The result is an effect of improving the focusing margin.

A halftone phase shift mask according to the first embodiment will be described below with reference to FIGS. 2A to 2C. This mask is for KrF excimer laser exposure.

By using a DC sputtering apparatus, argon (Ar) gas and oxygen ($O_2$) gas are introduced into a chamber, and a halftone film 22 made of a zirconium oxide is formed on a transparent quartz glass substrate 20 by reactive sputtering using a zirconium compound target. Optical conditions of the halftone film 22 are so determined that the transmittance to exposure light is 2 to 15%, the phase of light transmitted through the film is shifted 180° from the phase of light not transmitted through the film, the reflectance to exposure light is 30% or less, and the transmittance to light for mask inspection is 30% or less. Consequently, a phase shift mask blank as shown in FIG. 2A is manufactured.

Let the refractive index of the substrate 20 be $n_s$, the refractive index, extinction coefficient, and film thickness of the halftone film 22 be n, k, and d, respectively, and the refractive index of air be $n_0$. Then when light with a wavelength λ is incident perpendicularly on the blank from the halftone film, a transmittance T(%) and a reflectance R(%) are given by, $$T = t \cdot \bar{t} \cdot n_s \times 100 \quad (1)$$

$$R = r \cdot \bar{r} \times 100 \quad (2)$$

where $t = 2/(m_1 + m_2 \cdot n_s + m_3 + m_4 \cdot n_s)$ $\bar{t}$ is the complex conjugate of t $r = (m_1 + m_2 n_s - m_3 - m_4 \cdot n_s)/(m_1 + m_2 \cdot n_s + m_3 + m_4 \cdot n_s)$ $\bar{r}$ is the complex conjugate of r $m_1 = \cos \delta$ $m_2 = \sin \delta/(n - k \cdot I) \cdot I$ $m_3 = \sin \delta \cdot (n - k \cdot I) \cdot I$ $m_4 = \cos \delta$ $\delta = 2\pi(n - k \cdot I) d/\lambda$ I is an imaginary number unit.

Usually, λ, $n_0$ (=almost 1), and $n_s$ are known. Therefore, when n, k, and d are known, the values of T and R can be uniquely calculated from equations (1) and (2).
Where $$\begin{pmatrix} m_1 & m_2 \\ m_3 & m_4 \end{pmatrix}$$

is called a characteristic matrix.

In a phase shift mask, the phase shift is also important as well as T and R. To accurately calculate phases, the argument of a complex transmittance t must be used. However, a phase shift PS between light transmitted through the phase shift producing layer (halftone film 22) and light transmitting only through the substrate 20 without being transmitted through the phase shift producing layer can be calculated with practically satisfactory accuracy by $$PS = 2\pi(n-1)d/\lambda \quad (3)$$

The film formation conditions of the halftone film 22 shown in FIG. 2A are as follows.

Current control: 1A

Pressure: 0.43 Pa

Flow rate of Ar gas: 20 SCCM

Flow rate of $O_2$ gas: 2.7 SCCM

Figure 3:
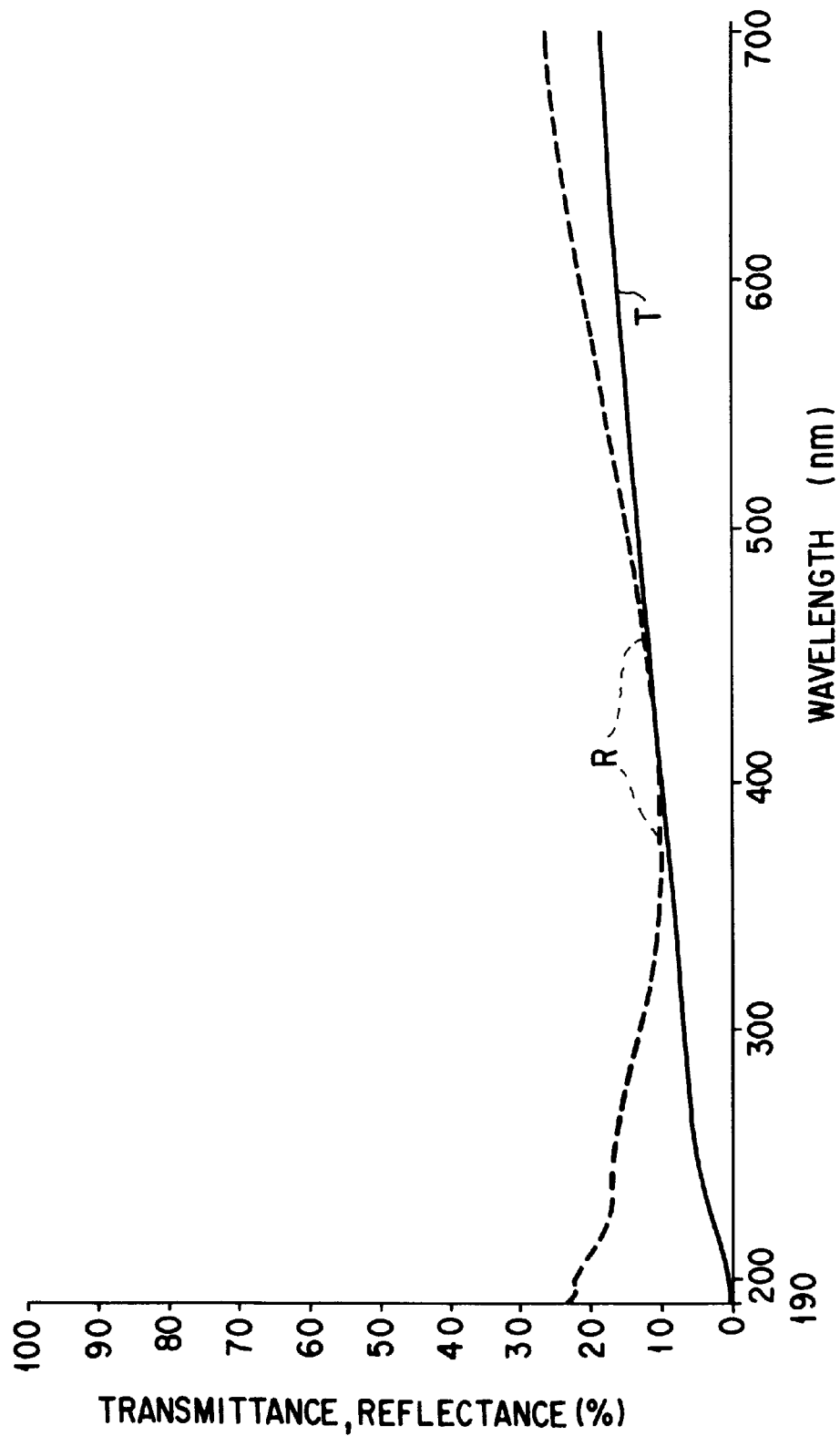
FIG. 3 is a graph showing the spectral reflectance characteristic and the spectral transmittance characteristic of the first embodiment.

FIG. 3 shows the spectral transmittance T characteristic and the spectral reflectance R characteristic of a halftone phase shift mask blank having a zirconium oxide compound film formed under the above film formation conditions. Optical constants at the exposure light wavelength (the wavelength of a KrF excimer laser beam: 248 nm) are that refractive index n=2.26 and extinction coefficient k=0.55. Film thickness d is set to 980 Å according to equation (3) to have a phase shift of 180°. As is apparent from FIG. 3, the blank has flat characteristics over a broad wavelength region. The spectral transmittance at 248 nm as the exposure light wavelength is 5.1%, the transmittance to the e-line (wavelength: 546 nm) of a high-pressure mercury lamp as inspection light is 14.8%, the transmittance to an He—Ne laser beam (wavelength: 633 nm) as another inspection light is about 18%, and the transmittance to an Ar laser beam (wavelength: 488 nm) as still another inspection light is about 13%. Accordingly, sufficient contrast can be obtained during inspection. Also, the reflectance at the wavelength 248 nm of the exposure light is 16.9%. Consequently, it is possible to prevent the influence of multiple reflection during exposure and obtain a satisfactory value.

Figure 2B:
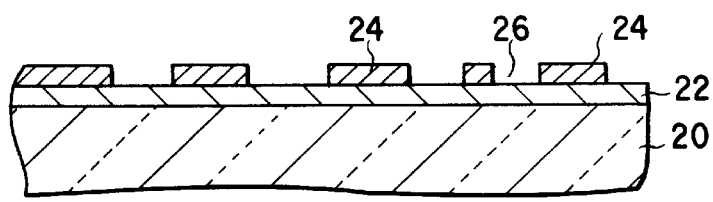

After the phase shift mask blank is cleaned, an electron-beam resist is coated by a spinner to form an electron-beam resist layer 24, and a predetermined pattern is drawn by an electron beam and developed to form a resist pattern 24 having apertures 26 (FIG. 2B). The sheet resistance of the zirconium oxide compound film formed under the film formation conditions described above is $1.43 \times 10^4$ Ω/λ. Accordingly, charge-up during the electron-beam lithography posed almost no problem.

Subsequently, the phase shift mask blank (FIG. 2B) having the resist pattern is patterned by dry etching. Thereafter, the electron-beam resist layer 24 is removed to obtain a halftone phase shift mask having a halftone pattern 22a (FIG. 2C).

Although zirconium oxide is used as a halftone film in the above description, the same effect can be obtained by using general zirconium compounds. For example, it is possible to use zirconium nitride, zirconium oxynitride, zirconium oxycarbide, zirconium carbonitride, zirconium halide (e.g., zirconium fluoride and zirconium chloride), zirconium halide oxide (e.g., zirconium fluoride oxide and zirconium chloride oxide), and zirconium halide nitride (e.g., zirconium fluoride nitride and zirconium chloride nitride).

As described above, the halftone phase shift mask blank of this embodiment has a structure in which a halftone film made from a thin zirconium compound is formed on a transparent glass substrate. The values of the optical constants (the refractive index n, the extinction coefficient k, and the film thickness d) of the halftone film are so selected as to achieve a reflectance of 30% or less at the exposure light wavelength and a transmittance of 30% br less at the inspection light wavelength, in addition to the standard optical conditions for the phase shift mask (the transmittance of exposure light transmitted through the halftone film: 2 to 15%, the phase shift between light transmitted through the halftone film and light not transmitted through the film: 180°). For example, the halftone film has a transmittance of 30% or less at the wavelength of visible light (e.g., a high-pressure mercury lamp e-line (546 nm) or an Ar ion laser beam (488 nm)) used in tests. Therefore, enough contrast can be obtained during the inspection. Also, the reflectance to the KrF laser wavelength is less than 30%. This prevents the pattern accuracy from being decreased due to multiple reflection occurring between the halftone layer and the wafer during photolithography. Since there is no influence of multiple reflection, no antireflection layer is necessary. Additionally, inspection and size measurement of the mask can be easily performed because the contrasts during the inspection and measurement are satisfactory.

Since a zirconium compound film has sufficient conductivity (sheet resistance 100 M Ω/□ or less), it is possible to prevent charge-up during electron-beam lithography and improve the pattern formation accuracy. Analogously, this conductivity eliminates charging of static electricity and prevents easy adhesion of dust during manufacturing steps of the mask or when the mask is in use. Also, a zirconium film is hard, so it is possible to reduce defects caused by damage or marring in the step of manufacturing the phase shift mask or the test step and achieve sufficient durability against sulfuric acid in the cleaning step. Furthermore, since the film is a single metal compound, the film has high pattern formation accuracy and high pattern shape reproducibility.

Other embodiments of the present invention will be described below. In the following embodiments, the same reference numerals as in the first embodiment denote the same parts, and a detailed description thereof will be omitted.

This second embodiment uses a zirconium silicide compound, e.g., a zirconium oxide silicide film, instead of a zirconium compound, as a halftone film. This mask is an i-line exposure mask.

Figure 2C:
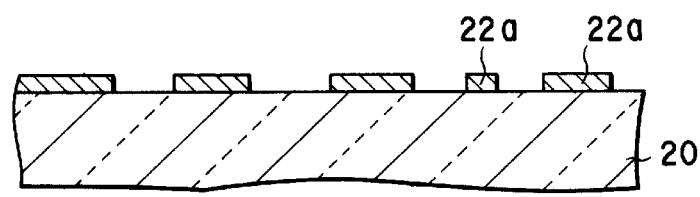

Manufacturing steps are the same as in the first embodiment shown in FIGS. 2A to 2C. The film formation conditions of the halftone film are as follows.

Figure 4:
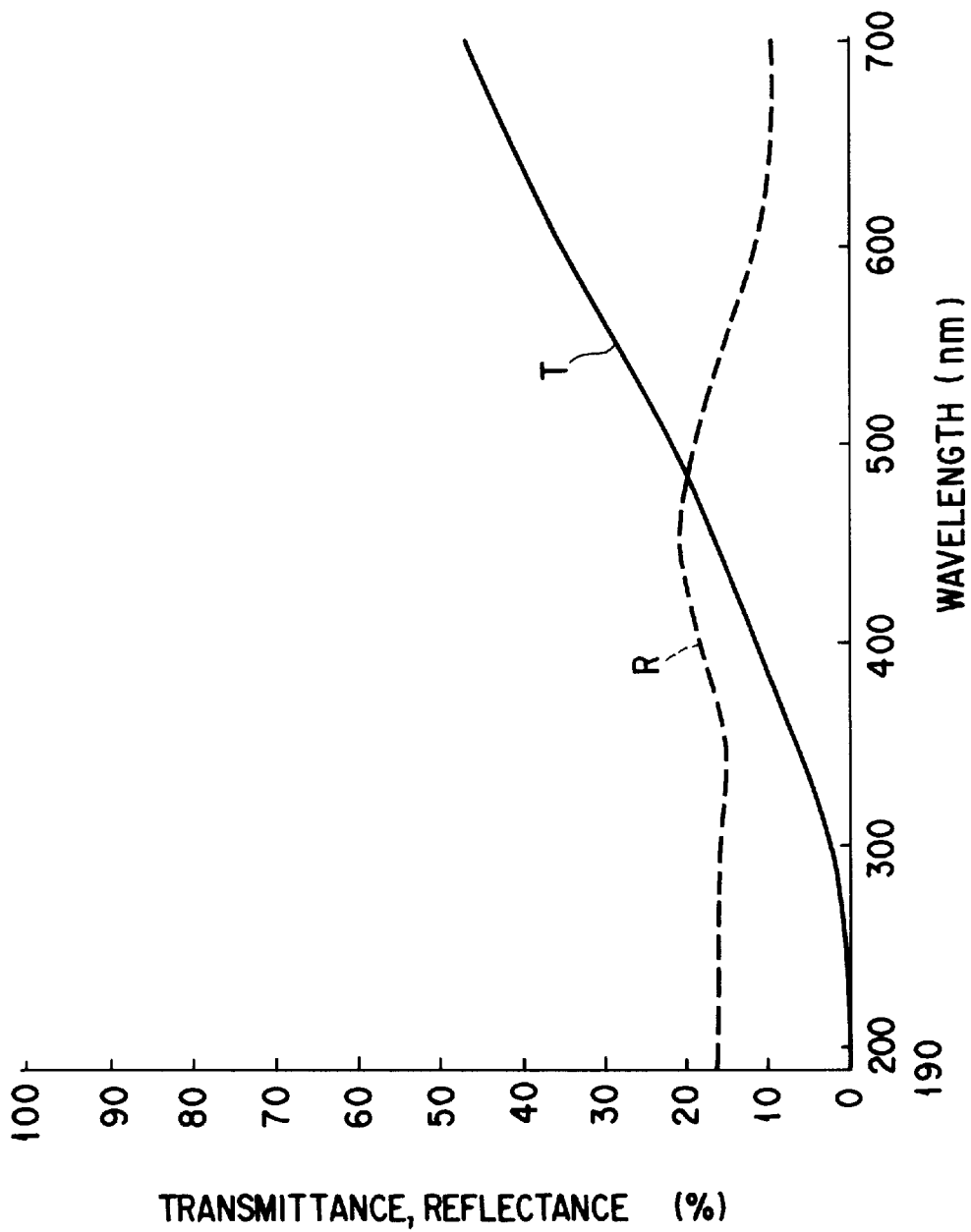
FIG. 4 is a graph showing the spectral reflectance characteristic and the spectral transmittance characteristic of the second embodiment.

Power: 400W(DC)
Pressure: 0.41 Pa
Flow rate of Ar gas: 21 SCCM
Flow rate of $O_2$ gas: 4.0 SCCM FIG. 4 shows the spectral transmittance T characteristic and the spectral reflectance R characteristic of a halftone phase shift mask blank having a zirconium oxide silicide film formed under the above film formation conditions. Optical constants at the exposure light wavelength (the wavelength of the i-line: 365 nm) are that n=2.18, k=0.48, and d=1400 Å. As is apparent from FIG. 4, the blank has flat characteristics over a broad wavelength region. The spectral transmittance at 365 nm as the exposure light wavelength is 8.0%, the transmittance to an Ar ion laser beam (wavelength: 488 nm) as inspection light is 20.9%, and the transmittance to the e-line (wavelength: 546 nm) of a high-pressure mercury lamp as another inspection light is about 28%. Accordingly, sufficient contrast can be obtained during inspection. Also, the reflectance at the wavelength 365 nm of the exposure light is 16.9%. Consequently, it is possible to prevent the influence of multiple reflection during exposure and obtain a satisfactory value. Furthermore, the sheet resistance is $5.52 \times 10^6$ $\Omega/\square$, so charge-up during the electron-beam lithography posed almost no problem.

The halftone film in the second embodiment is not limited to zirconium oxide silicide. For example, it is possible to use zirconium nitride silicide, zirconium oxynitride silicide, zirconium oxycarbide silicide, zirconium carbonitride silicide, zirconium halide silicide (e.g., zirconium fluoride silicide and zirconium chloride silicide), zirconium halide oxide silicide (e.g., zirconium fluoride oxide silicide and zirconium chloride oxide silicide), and zirconium halide nitride silicide (e.g., zirconium fluoride nitride silicide and zirconium chloride nitride silicide).

As described above, the halftone phase shift mask blank of the second embodiment has a structure in which a halftone film made from a thin zirconium oxide silicide compound film having an aperture pattern is formed on a transparent glass substrate. The values of the optical constants (the refractive index n, the extinction coefficient k, and the film thickness d) of the halftone film are so selected as to achieve a reflectance of 30% or less at an exposure light wavelength and a transmittance of 30% or less at the inspection light wavelength, in addition to the standard optical conditions for the phase shift mask (the transmittance of exposure light transmitted through the halftone film: 2 to 15%, the phase shift between light transmitted through the halftone film and light not transmitted through the film: 180°). For example, the halftone film has a transmittance of 30% or less at the wavelength of visible light (e.g., a high-pressure mercury lamp e-line (546 nm) or an Ar ion laser beam (488 nm)) used in inspection. Therefore, enough contrast can be obtained during the inspection. Also, the reflectance to the i-line wavelength (365 nm) is less than 30%. This prevents the pattern accuracy from being decreased due to multiple reflection occurring between the halftone layer and the wafer during photolithography. Since there is no influence of multiple reflection, no antireflection layer is necessary. Additionally, inspection and size measurement of the mask can be easily performed because the contrasts during the inspection and measurement are satisfactory.

Since a zirconium oxide compound film has sufficient conductivity (sheet resistance 100 M $\Omega/\square$ or less), it is possible to prevent charge-up during electron-beam lithography and improve the pattern formation accuracy. Analogously, this conductivity eliminates charging of static electricity and prevents easy adhesion of dust during manufacturing steps of the mask or when the mask is in use. Also, a zirconium silicide film is hard, so it is possible to reduce defects caused by damage or marring in the step of manufacturing a phase shift mask or the test step and achieve sufficient durability against sulfuric acid in the cleaning step. Furthermore, since the film is a single metal compound, the film has high pattern formation accuracy and high pattern shape reproducibility.

Figure 5A:
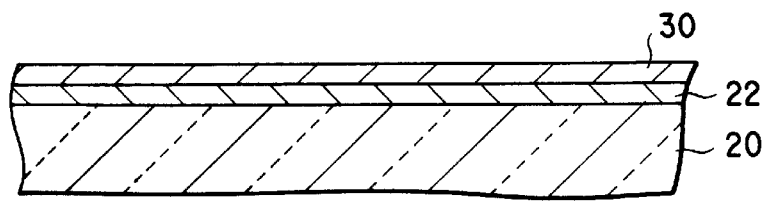
FIGS. 5A to 5C are sectional views for explaining manufacturing steps of the third embodiment of a halftone phase shift mask according to the present invention.
Figure 5B:
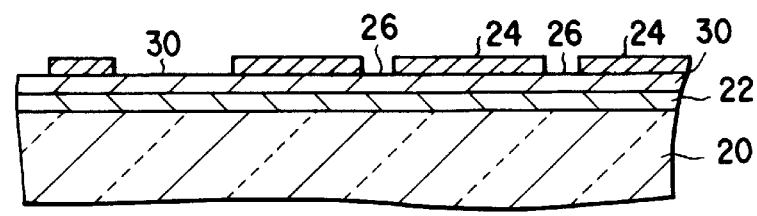
Figure 5C:
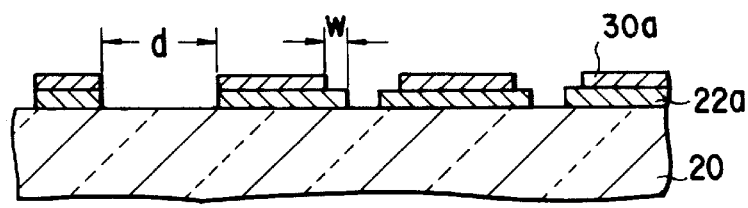

In the first and second embodiments, phase shift masks having single-layer halftone films made of a zirconium oxide and a zirconium oxide silicide, respectively, have been explained. As the third embodiment, an embodiment in which a light-shielding film is additionally formed on these halftone films will be described. FIGS. 5A to 5C show manufacturing steps of a mask obtained by forming a light-shielding film in the first embodiment.

By using a DC sputtering apparatus, argon (Ar) gas and oxygen ($O_2$) gas are introduced into a chamber, and a halftone film 22 made of a zirconium oxide is formed on a transparent quartz glass substrate 20 by reactive sputtering using a zirconium compound target. A light-shielding film 30 is formed on the halftone film 22.

This light-shielding film 30 is made from a single metal layer or a plurality of layers of a metal and a metal compound (for lowering the reflectance). Cr, Zr, ZrSi, Mo, MoSi, Ta, TaSi, or the like is used as a metal, and an oxide, a nitride, a carbide, or a halide (a fluoride or a chloride) is used as a metal compound.

Consequently, a phase shift mask blank as shown in FIG. 5A is manufactured.

The film formation conditions and optical constants of the halftone film 22 shown in FIG. 5A are the same as in the first embodiment.

Subsequently, after the phase shift mask blank is cleaned, a halftone film pattern is drawn on the halftone mask blank with the light-shielding layer by an electron beam and developed to form a resist pattern 24 having apertures 26 (FIG. 5B).

The light-shielding film 30 is dry etched with the resist pattern 24 and the halftone film 22 is dry etched with the light-shielding pattern as the mask. The electron-beam resist layer is coated on the entire surface of the light-shielding film 30. After the light-shielding pattern is drawn by an electron beam and developed, the light-shielding film 30 is dry etched with the resist pattern to remove the electron-beam resist layer. As a result, the halftone phase shift mask with a light-shielding film 30a having a halftone pattern 22a (FIG. 5C).

The manufacturing method of the halftone phase shift mask is not limited to the above method. In the alternate way, the light-shielding pattern is drawn by an electron beam on the halftone phase shift mask blank with the light-shielding film and the blank is developed to form the resist pattern. The light-shielding film is dry etched with the resist pattern and the resist is removed. The electron-beam resist layer is coated on the entire surface of the light-shielding film. After the halftone film pattern is drawn by an electron beam and developed, the halftone film is dry etched with the resist pattern to remove the electron-beam resist layer.

As described above, according to the halftone phase shift mask of the third embodiment, the halftone film of the halftone phase shift mask is light shielded at the portion except the edge portion thereof. It is required for the halftone film to have transmittance about 2 to 15%. However, it is not necessary to have transmittance of this level except the edge portion of the halftone pattern. Therefore, the edge of the light-shielding film 30a is located inside the edge by a distance w. The optimum distance w depends on the width d of the pattern. The reason why the light-shielding film is used is to improve the resolution of the fine pattern by using the phase shift technique. It is not necessary to use the phase shift technique for the rough pattern with a large pattern width. For the pattern having a large width, it is possible to set the distance w at 0.

Although not shown, a mask manufactured by forming a light-shielding film in the second embodiment has the same effect as the third embodiment.

The above embodiments relate to a phase shift mask having a single-layer halftone film. However, the present invention is also applicable to a mask having a multi-layer halftone film. Embodiments in which the halftone films of the first to third embodiments are replaced with multi-layer films will be described below.

A halftone phase shift mask of the fourth embodiment will be described below with reference to FIGS. 6A to 6C. The fourth embodiment is a mask for KrF excimer laser exposure.

By using a DC sputtering apparatus, argon (Ar) gas at a flow rate: 20 SCCM, oxygen ($O_2$) gas at a flow rate: 3 SCCM, and $N_2$ gas at a flow rate: 4 SCCM are introduced into a chamber, and a first halftone film 42 made from a zirconium oxynitride film having a thickness d of 622 Å is formed on a transparent quartz glass substrate 40 by reactive sputtering using a zirconium compound target. The halftone film 42 has a refractive index n of 2.20 and an extinction coefficient k of 0.21 at an exposure light wavelength of 248 nm.

Next, by using a DC sputtering apparatus similar to the one described above, argon (Ar) gas at a flow rate: 20 SCCM and oxygen ($O_2$) gas at a flow rate: 2 SCCM are introduced into a chamber, and a second halftone film 44 made from a zirconium oxide compound film having a thickness d of 624 Å is formed on the zirconium oxynitride film 42 by reactive sputtering using a zirconium compound target. The halftone film 44 has a refractive index n of 1.79 and an extinction coefficient k of 0.72 at an exposure light wavelength of 248 nm.

Figure 6A:
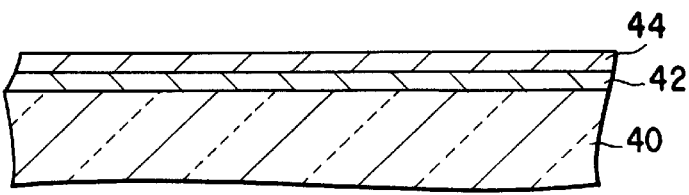
FIGS. 6A to 6C are sectional views for explaining manufacturing steps of the fourth embodiment of a halftone phase shift mask according to the present invention.

Through the above steps, as shown in FIG. 6A, a halftone phase shift mask blank corresponding to KrF excimer laser exposure is obtained.

Letting the characteristic matrix of the upper layer (farther from the substrate) of the two-layer film be $$\begin{pmatrix} m_{1U} & m_{2U} \\ m_{3U} & m_{4U} \end{pmatrix}$$

and that of the lower layer (nearer to the substrate) be $$\begin{pmatrix} m_{1L} & m_{2L} \\ m_{3L} & m_{4L} \end{pmatrix},$$

the characteristic matrix of the two layers as a whole is the product of these matrices written as follows.

$$\begin{pmatrix} m_{1U} & m_{2U} \\ m_{3U} & m_{4U} \end{pmatrix} \begin{pmatrix} m_{1L} & m_{2L} \\ m_{3L} & m_{4L} \end{pmatrix} = \begin{pmatrix} m_1 & m_2 \\ m_3 & m_4 \end{pmatrix}$$

By letting the product of the two matrixes be $m_1$, $m_2$, $m_3$, and $m_4$, T and R can be calculated by directly using equations (1) and (2) as in the case of a single-layer film.

Analogously, these values for an n-layer film can be calculated by as follows.

$$\begin{pmatrix} m_{1U} & m_{2U} \\ m_{3U} & m_{4U} \end{pmatrix} \cdots \begin{pmatrix} m_{1n} & m_{2n} \\ m_{3n} & m_{4n} \end{pmatrix} = \begin{pmatrix} m_1 & m_2 \\ m_3 & m_4 \end{pmatrix}$$

Similar to the first embodiment, a phase shift PS between light transmitted through the phase shift producing layer (halftone films 42 and 44) and light transmitting only through the substrate 40 without being transmitted through the phase shift producing layer can be calculated by as follows.

$$PS = 2\pi\{(n_1-1)d_1 + (n_2-2)d_2 + \ldots (n_N-1)d_N\}/\lambda \quad (4)$$

The transmittance characteristics of the first and second halftone films are so chosen that the transmittance characteristic of the first halftone film (close to the substrate) is more transparent than a desired transmittance characteristic, the transparent characteristic of the second halftone film is more opaque than the desired transmittance characteristic, and the desired transmittance characteristic is obtained when they are synthesized. If the total sheet resistance of the multi-layer halftone film is lower that 100 M Ω/□, it is possible to reverse the above relationship. That is, the transmittance characteristic of the first halftone film is more opaque than a desired transmittance characteristic and the transmittance characteristic of the second halftone film is more transparent than the desired transmittance characteristic. In the fourth embodiment, it is possible to reverse the above relationship since the extinction coefficient k of the first halftone layer is 0.21.

Figure 7:
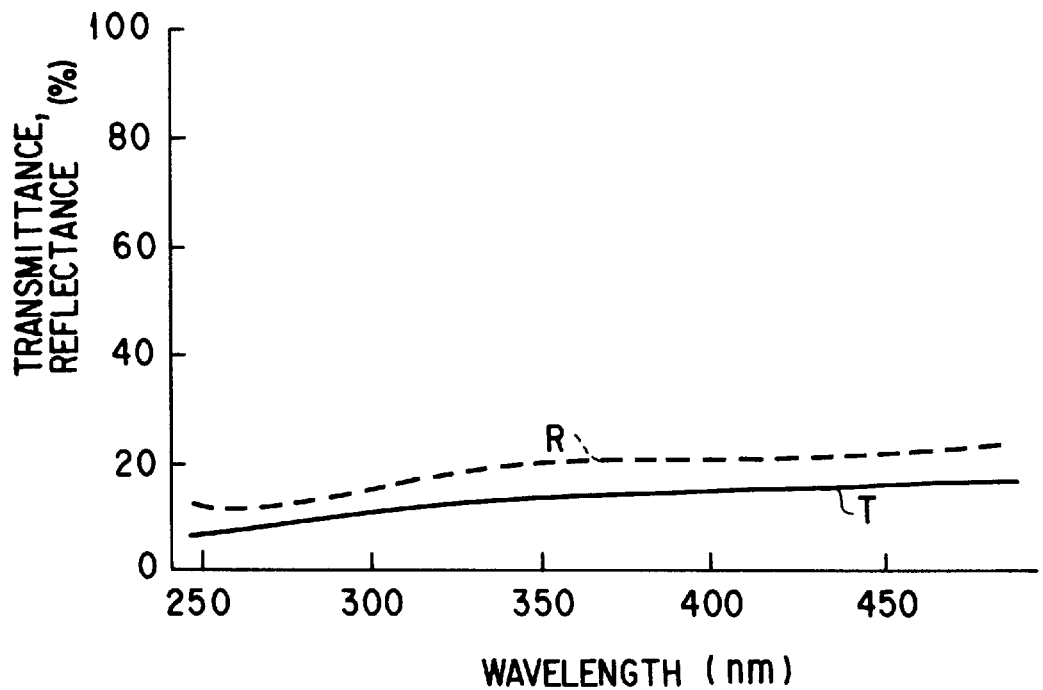
FIG. 7 is a graph showing the spectral reflectance characteristic and the spectral transmittance characteristic of the fourth embodiment.

FIG. 7 shows the spectral transmittance T characteristic and the spectral reflectance R characteristic of the shift mask blank shown in FIG. 6A. The transmittance at the exposure light wavelength (the wavelength of a KrF excimer laser: 248 nm) is 5%, and the transmittance at the inspection light wavelength (488 nm) is 15.7%. Accordingly, sufficient contrast can be obtained during inspection. Also, the reflectance at the wavelength 248 nm of the exposure light is 12.2%. Consequently, it is possible to prevent the influence of multiple reflection during exposure and obtain a satisfactory value.

Figure 6B:
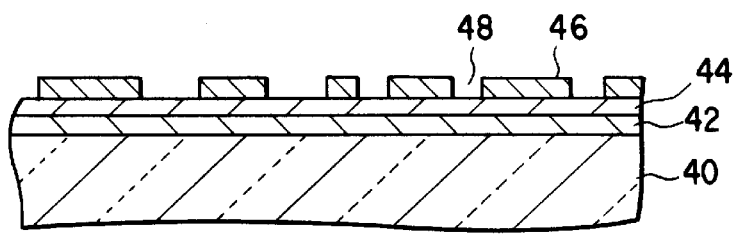

After the phase shift mask blank is cleaned, an electron-beam resist is coated by a spinner to form an electron-beam resist layer 46, and a predetermined pattern is drawn by an electron beam and developed to form a resist pattern having apertures 48 (FIG. 6B). The sheet resistance of the second halftone film 44 made from a zirconium oxide compound film is $3.43 \times 10^3$ Ω/☐. Accordingly, charge-up during the electron-beam lithography posed almost no problem.

Figure 6C:
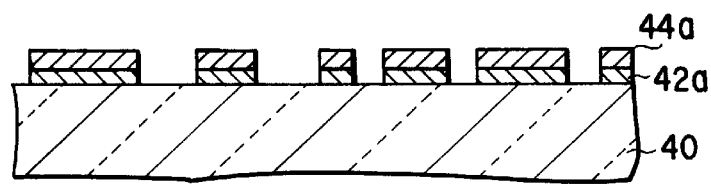

After the phase shift mask blank (FIG. 6B) having the resist pattern is patterned by dry etching using a halogen gas such as $SiCl_4$, $SF_6$, or $CF_4$, the electron-beam resist layer 46 is removed to obtain a halftone phase shift mask having halftone patterns 42a and 44a (FIG. 6C). The dry etching conditions are that the pressure is 30 mTorr, the power is 300W, and the flow rate of $SiCl_4$ gas is 50 SCCM.

Although the combination of zirconium oxide and a zirconium oxynitride film is used as a halftone film in the above description, the same effect can be obtained by using general zirconium compounds. For example, it is possible to use the combination of any of zirconium nitride, zirconium oxynitride, zirconium oxycarbide, zirconium carbonitride, zirconium halide (e.g., zirconium fluoride and zirconium chloride), zirconium halide oxide (e.g., zirconium fluoride oxide and zirconium chloride oxide), and zirconium halide nitride (e.g., zirconium fluoride nitride and zirconium chloride nitride).

As described above, the halftone phase shift mask blank of this embodiment has a structure in which a halftone film made from a multi-layer thin zirconium compound films having aperture patterns is formed on a transparent glass substrate. The values of the optical constants (the refractive index n, the extinction coefficient k, and the film thickness d) of the halftone film are so selected as to achieve a reflectance of 30% or less at the exposure light wavelength and a transmittance of 30% or less at the inspection light wavelength, in addition to the optical conditions for the phase shift mask (the transmittance of exposure light transmitted through the halftone film: 2 to 15%, the phase shift between light transmitted through the halftone film and light not transmitted through the film: 180°). For example, the halftone film has a transmittance of 30% or less at the wavelength of visible light (e.g., a high-pressure mercury lamp e-line (546 nm) or an Ar ion laser beam (488 nm)) used in inspection. Therefore, enough contrast can be obtained during the inspection. Also, the reflectance to the KrF laser wavelength is less than 30%. This prevents the pattern accuracy from being decreased due to multiple reflection occurring between the halftone layer and the wafer during photolithography. Since there is no influence of multiple reflection, no antireflection layer is necessary. Additionally, inspection and size measurement of the mask can be easily performed because the contrasts during the inspection and measurement are satisfactory.

Since a zirconium compound film has a sufficient conductivity (sheet resistance 100M Ω/☐ or less), it is possible to prevent charge-up during electron-beam lithography and improve the pattern formation accuracy. Analogously, this conductivity eliminates charging of static electricity and prevents easy adhesion of dust during manufacturing steps of the mask or when the mask is in use. Also, a zirconium film is hard, so it is possible to reduce defects caused by damage or marring in the step of manufacturing the phase shift mask or the test step and achieve sufficient durability against sulfuric acid in the cleaning step. Furthermore, since the film is a single metal compound, the film has high pattern formation accuracy and high pattern shape reproducibility.

The fifth embodiment which uses a multi-layer film of the same kind as in the fourth embodiment and having different optical constants will be described below. The fifth embodiment is a mask for ArF laser exposure.

By using a DC sputtering apparatus similar to that in the fourth embodiment, argon (Ar) gas at a flow rate: 14 SCCM, oxygen ($O_2$) gas at a flow rate: 8 SCCM, and nitrogen ($N_2$) gas at a flow rate: 8 SCCM are introduced into a chamber, and a first halftone film made from a 345 Å thick zirconium oxynitride film is formed on a transparent quartz glass substrate by reactive sputtering using a zirconium compound target. The first halftone film has a refractive index of 2.80 and an extinction coefficient of 0.33 at an exposure light wavelength of 193 nm.

Subsequently, by using a DC sputtering apparatus similar to the one described above, argon (Ar) gas at a flow rate: 20 SCCM and oxygen ($O_2$) gas at a flow rate: 2 SCCM are introduced into a chamber, and a second halftone film made from a 299 Å thick zirconium oxide compound film is formed on the zirconium oxynitride film by reactive sputtering using a zirconium compound target. The second halftone film has a refractive index of 2.15 and an extinction coefficient of 1.08 at an exposure light wavelength of 193 nm.

Through the above steps, a halftone phase shift mask blank corresponding to ArF excimer laser exposure is obtained.

Figure 8:
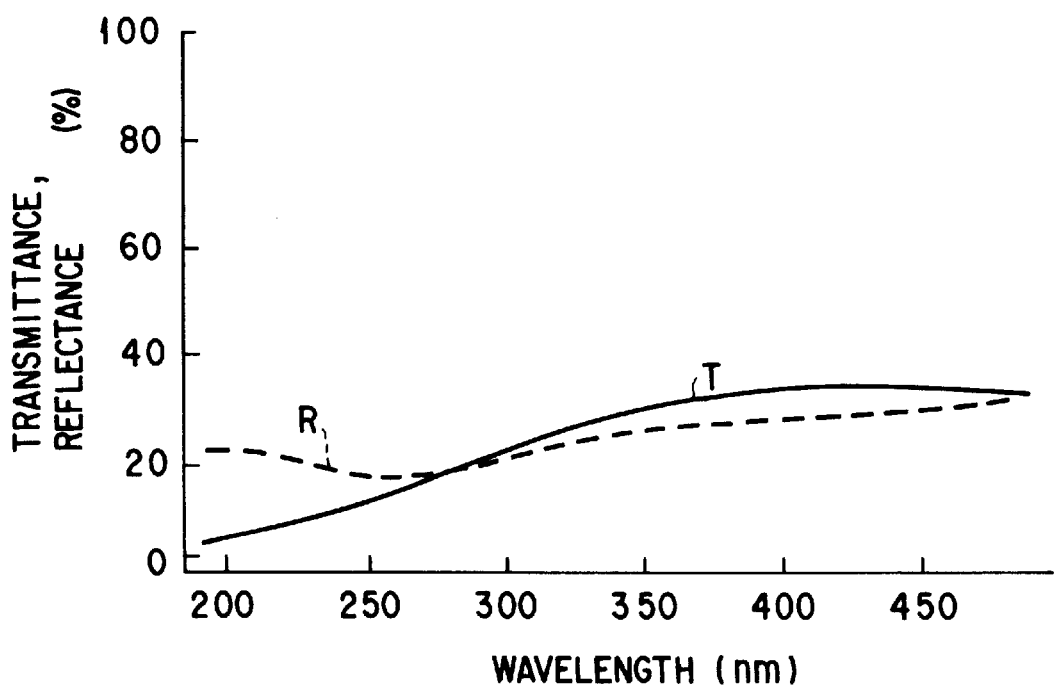
FIG. 8 is a graph showing the spectral reflectance characteristic and the spectral transmittance characteristic of the fifth embodiment.

FIG. 8 shows the spectral transmittance T characteristic and the spectral reflectance R characteristic of the shift mask blank of the fifth embodiment. Exposure is performed by an ArF excimer laser. The transmittance at the exposure light wavelength (193 nm) is 5%, and the transmittance at the inspection light wavelength (488 nm) is 15.7%. Accordingly, sufficient contrast can be obtained during inspection. Also, the reflectance at the wavelength 248 nm of the exposure light is 12.2%. Consequently, it is possible to prevent the influence of multiple reflection during exposure and obtain a satisfactory value.

The sixth embodiment uses a zirconium silicide compound, e.g., a zirconium oxide silicide film, instead of a zirconium compound, as a multi-layer halftone film. The sixth embodiment is a mask for KrF excimer laser exposure.

The manufacturing steps are the same as in the fourth embodiment shown in FIGS. 6A to 6C.

By using a DC sputtering apparatus similar to that in the fourth embodiment, argon (Ar) gas and oxygen ($O_2$) gas are introduced into a chamber, and first and second halftone films made from two zirconium oxide silicide films are formed, such that the transmittance is 6% when the phase shift is 180°, on a transparent quartz glass substrate by reactive sputtering using a zirconium silicide target. The film thickness of the first halftone film is 600 Å, and that of the second halftone film 480 Å.

The film formation conditions of the first and second halftone films are as follows. A film farther from the substrate is the second halftone film. Film formation conditions of first halftone film Power: 200W Pressure: 0.45 Pa Flow rate ratio of Ar gas to $O_2$ gas: 80/20 Film formation conditions of second halftone film Power: 200W Pressure: 0.43 Pa Flow rate ratio of Ar gas to $O_2$ gas: 90/10

At an exposure light wavelength of 248 nm, optical constants of the first halftone film are refractive index n=1.95 and extinction coefficient k=0.004, and those of the second halftone film are refractive index n=2.41 and extinction coefficient k=1.01.

Figure 9:
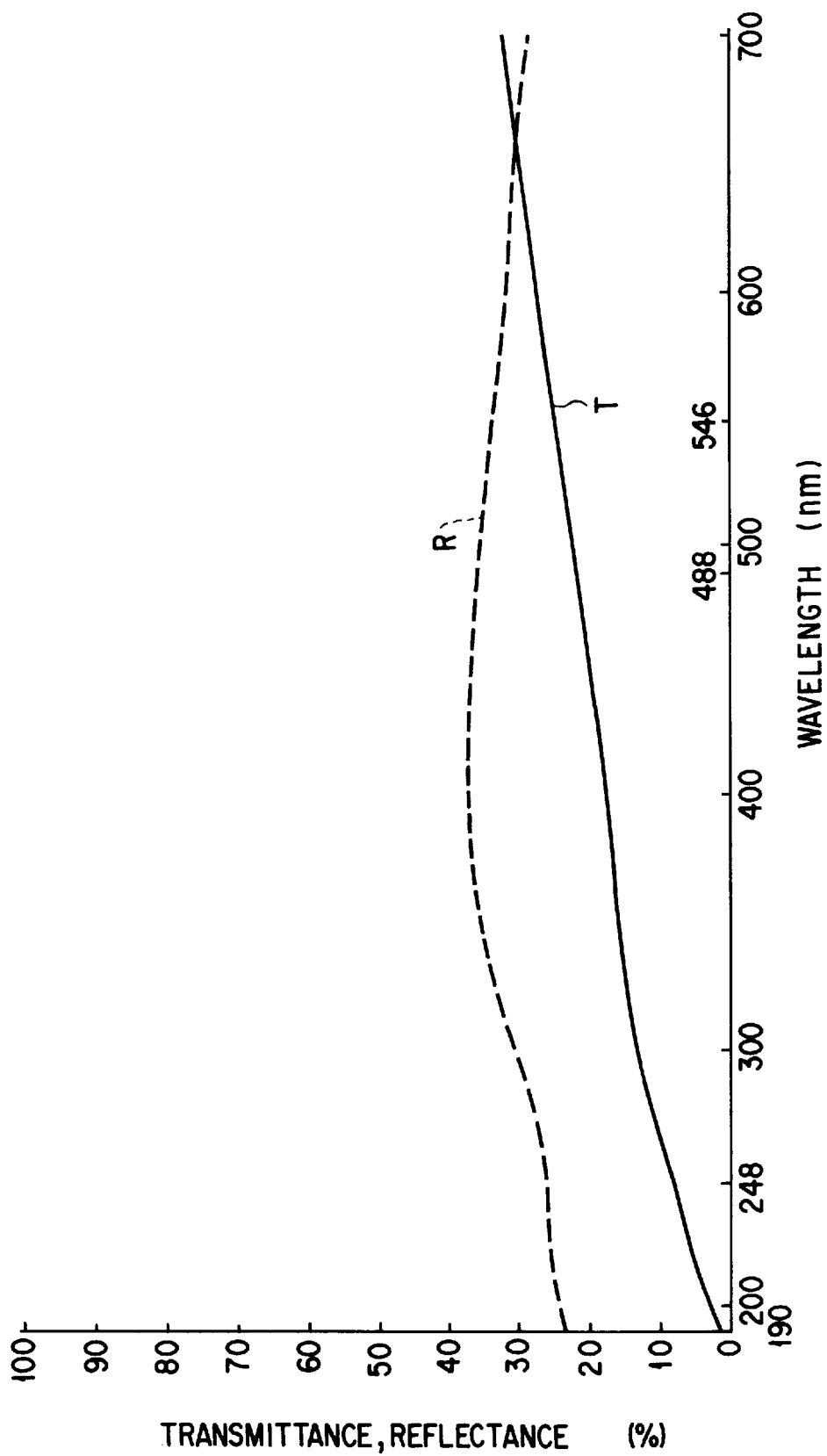
FIG. 9 is a graph showing the spectral reflectance characteristic and the spectral transmittance characteristic of the sixth embodiment.

FIG. 9 shows the spectral transmittance characteristic and the spectral reflectance characteristic of a halftone phase shift mask blank made from zirconium oxide silicide films formed under the above film formation conditions. As is apparent from FIG. 9, the mask has flat characteristics over a broad wavelength region. The spectral transmittance at 248 nm as the wavelength of a KrF excimer laser as exposure light is 6.7%, and the transmittance at a inspection light wavelength of 546 nm is 26.8%. Accordingly, sufficient contrast can be obtained during inspection. Also, the reflectance at the wavelength 248 nm of the exposure light is 24.7%. Consequently, it is possible to prevent the influence of multiple reflection during exposure and obtain a satisfactory value.

The sheet resistance of the zirconium oxide silicide film is 3.33 k $\Omega/\square$. Accordingly, charge-up during the electron-beam lithography posed almost no problem.

The seventh embodiment which uses a multi-layer film of the same kind as in the sixth embodiment and having different optical constants will be described below.

The seventh embodiment is a halftone phase shift mask blank for ArF excimer laser exposure. FIG. 10 shows the spectral transmittance T characteristic and the spectral reflectance R characteristic of the shift mask blank of the seventh embodiment. Exposure is performed by an ArF excimer laser. The transmittance at the exposure light wavelength (193 nm) is 5%, and the transmittance at the inspection light wavelength (365 nm) is about 29%. Accordingly, sufficient contrast can be obtained during inspection. Also, the reflectance at the wavelength 193 nm of the exposure light is about 28%. Consequently, it is possible to prevent the influence of multiple reflection during exposure and obtain a satisfactory value.

At the exposure light wavelength 193 nm, optical constants of a first halftone film are n=1.91 and k=0.14. Those of a second halftone film are n=2.01 and k=1.30. In order to have a phase shift of 180° and a desired transmittance of the multi-layer film, the thickness of the first halftone film is set to 830 Å and that of the second halftone film is set to 210 Å according to equation (4).

Figure 11A:
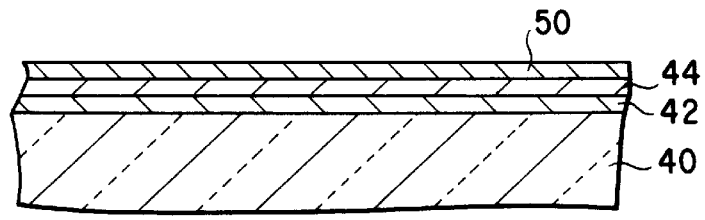
FIGS. 11A to 11C are sectional views for explaining manufacturing steps of the eighth embodiment of a halftone phase shift mask according to the present invention.
Figure 11B:
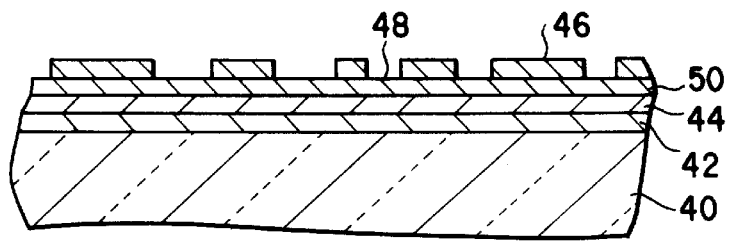
Figure 11C:
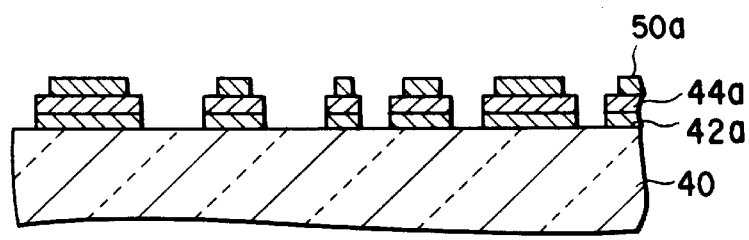

In the fourth to seventh embodiments, phase shift masks having halftone films made from multi-layer zirconium oxide compound films have been explained. As the eighth embodiment, an embodiment in which a light-shielding film is additionally formed on these halftone films will be described. FIGS. 11A to 11C show manufacturing steps of a mask obtained by forming a light-shielding film in the fourth embodiment.

This light-shielding film 50 is made from a single metal layer or a plurality of layers of a metal and a metal compound (for lowering the reflectance). Cr, Zr, ZrSi, Mo, MoSi, Ta, TaSi, or the like is used as a metal, and an oxide, a nitride, a carbide, or a halide (a fluoride or a chloride) is used as a metal compound. The phase shift mask blank as shown in FIG. 11A is manufactured.

The film formation conditions and optical constants of the halftone films 42 and 44 shown in FIG. 11A are the same as in the fourth embodiment.

The manufacturing method for the phase shift mask having the light-shielding film is the same as in the third embodiment shown in FIGS. 5A to 5C. Therefore, it is possible to set the distance w at 0 for the pattern having a large width.

As described above, according to the eighth embodiment, there is provided a halftone phase shift mask with the light-shielding film.

Although not shown, masks manufactured by forming a light-shielding film in the fifth to seventh embodiments have the same effect as the eighth embodiment.

The present invention is not limited to the above embodiments and can be practiced in the form of various modifications. For example, although the embodiments are separately explained, a plurality of embodiments can be appropriately combined. The substrate is not limited to a quartz glass. A calcium fluoride may be used as the substrate for an ArF laser exposure blank or mask. An RF sputtering apparatus may be instead of the DC sputtering apparatus. Inert gas used in the sputtering apparatus may include xenon gas, nitrogen gas, nitrogen oxide gas, nitrogen dioxide gas, or halogen gas.

In the present invention as has been described above, a halftone film made from a thin zirconium compound film is formed on a transparent substrate, and the values of the refractive index n, the extinction coefficient k, and the film thickness d of the zirconium compound film are so selected as to achieve a reflectance of 30% or less at the exposure light wavelength and a transmittance of 30% or less at the inspection light wavelength, in addition to the optical conditions for the halftone phase shift mask (the transmittance of exposure light transmitted through the halftone film: 2 to 15%, the phase shift between light transmitted through the halftone film and light not transmitted through the film but only through the substrate: 180°). Therefore, enough contrast can be obtained during the inspection. Also, the reflectance to the exposure light wavelength is less than 30%. This prevents the pattern accuracy from being decreased due to multiple reflection occurring between the halftone layer and the wafer during photolithography. Since there is no influence of multiple reflection, no antireflection layer is necessary. Additionally, inspection and size measurement of the mask can be easily performed because the contrasts during the inspection and measurement are satisfactory. Furthermore, since a zirconium compound film has sufficient conductivity, it is possible to prevent charge-up during electron-beam lithography and improve the pattern formation accuracy. Analogously, this conductivity eliminates charging of static electricity and prevents easy adhesion of dust during manufacturing steps of the mask or when the mask is in use. Also, a zirconium film is hard, so it is possible to reduce defects caused by damage or marring in the step of manufacturing the phase shift mask or the test step and achieve sufficient durability against sulfuric acid in the cleaning step. Furthermore, since the film is a single metal compound, the film has high pattern formation accuracy and high pattern shape reproducibility.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A blank for a halftone phase shift mask, comprising:
a transparent substrate; and
a halftone film formed on said substrate and made of a zirconium compound, said halftone film giving a phase shift of 180° between light transmitted through the halftone film and light not transmitted through the halftone film, the halftone film having a reflectance of not more than 30% to an exposure light.

2. A blank according to claim 1, wherein said halftone film is a single-layer film.

3. A blank according to claim 1, wherein said halftone film is a two-layer film.

4. A blank according to claim 1, wherein said zirconium compound is zirconium oxide, zirconium nitride, zirconium oxynitride, zirconium oxycarbide, zirconium carbonitride, zirconium halide, zirconium halide oxide, or zirconium halide nitride.

5. A blank according to claim 4, wherein said halide is a fluoride or a chloride.

6. A blank according to claim 1, wherein said zirconium compound is a zirconium silicide compound.

7. A blank according to claim 6, wherein said zirconium silicide compound is zirconium oxide silicide, zirconium nitride silicide, zirconium oxynitride silicide, zirconium oxycarbide silicide, zirconium carbonitride silicide, zirconium halide silicide, zirconium halide oxide silicide, or zirconium halide nitride silicide.

8. A blank according to claim 7, wherein said halide is a fluoride or a chloride.

9. A blank according to claim 1, further comprising a light-shielding layer on said halftone film.

10. A blank according to claim 9, wherein said light-shielding layer is a single-layer film of a metal.

11. A blank according to claim 9, wherein said light-shielding layer is a multi-layer film of a metal and a metal compound.

12. A blank according to claim 10, wherein said metal layer is made of chromium, zirconium or zirconium silicide, Mo, MoSi, Ta, or TaSi.

13. A blank according to claim 11, wherein said compound is an oxide, a nitride, a oxynitride, a oxycarbide, a carbonitride, a halide, a halide oxide, or a halide nitride.

14. A blank according to claim 13, wherein said halide is a fluoride or a chloride.

15. A blank according to claim 1, wherein said halftone film has a transmittance of 2 to 15% to an exposure light, and a transmittance of not more than 30% to an inspection light.

16. A blank according to claim 1, wherein a refractive index, an extinction coefficient, and a film thickness of said halftone film are so set to obtain a transmittance to an exposure light of 2 to 15% and a transmittance to an inspection light of not more than 30%.

17. A blank according to claim 1, wherein said halftone film has a conductivity of not more than 100 M $\Omega/\square$.

18. A blank according to claim 1, wherein said substrate is a quartz glass or a calcium fluoride.

19. A halftone phase shift mask comprising:

a transparent substrate; and a patterned halftone film formed on said substrate and made of a zirconium compound, said halftone film giving a phase shift of 180° between light transmitted through the halftone film and light not transmitted through the halftone film, the halftone film having a reflectance of not more than 30% to an exposure light.

20. A mask according to claim 19, wherein said halftone film is a single-layer film.

21. A mask according to claim 19, wherein said halftone film is a two-layer film.

22. A mask according to claim 19, wherein said zirconium compound is zirconium oxide, zirconium nitride, zirconium oxynitride, zirconium oxycarbide, zirconium carbonitride, zirconium halide, zirconium halide oxide, or zirconium halide nitride.

23. A mask according to claim 22, wherein said halide is a fluoride or a chloride.

24. A mask according to claim 19, wherein said zirconium compound is a zirconium silicide compound.

25. A mask according to claim 24, wherein said zirconium silicide compound is zirconium oxide silicide, zirconium nitride silicide, zirconium oxynitride silicide, zirconium oxycarbide silicide, zirconium carbonitride silicide, zirconium halide silicide, zirconium halide oxide silicide, or zirconium halide nitride silicide.

26. A mask according to claim 25, wherein said halide is a fluoride or a chloride.

27. A mask according to claim 19, further comprising a light-shielding layer on said halftone film.

28. A mask according to claim 27, wherein said light-shielding layer is a single-layer film of a metal.

29. A mask according to claim 27, wherein said light-shielding layer is a multi-layer film of a metal and a metal compound.

30. A mask according to claim 28, wherein said metal layer is made of chromium, zirconium or zirconium silicide, Mo, MoSi, Ta, or TaSi.

31. A mask according to claim 29, wherein said compound is an oxide, a nitride, a oxynitride, a oxycarbide, a carbonitride, a halide, a halide oxide, or a halide nitride.

32. A mask according to claim 31, wherein said halide is a fluoride or a chloride.

33. A mask according to claim 19, wherein said halftone film has a transmittance of 2 to 15% to an exposure light, and a transmittance of not more than 30% to an inspection light.

34. A mask according to claim 19, wherein a refractive index, an extinction coefficient, and a film thickness of said halftone film are so set to obtain a transmittance to an exposure light of 2 to 15% and a transmittance to an inspection light of not more than 30%.

35. A mask according to claim 19, wherein said halftone film has a conductivity of not more than 100 M $\Omega/\square$.

36. A mask according to claim 19, wherein said substrate is a quartz glass or a calcium fluoride.

37. A method of manufacturing a blank for a halftone phase shift mask, wherein a transparent substrate is placed in a sputtering apparatus containing inert gas, and a zirconium compound target is reactively sputtered to form at least one halftone film made of a zirconium compound on said substrate.

38. A method according to claim 37, wherein a light-shielding film is further formed on said halftone film.

39. A method of manufacturing a halftone phase shift mask, comprising the steps of:

placing a transparent substrate in a sputtering apparatus containing inert gas, and reactively sputtering a zirconium compound target to form at least one halftone film made of a zirconium compound on said substrate, thereby forming a blank for a halftone phase shift mask;

forming a resist pattern corresponding to an exposure pattern on said halftone film; and removing said resist pattern by etching.

40. A method according to claim 39, wherein a light-shielding film is further formed on said halftone film.

* * * * *